United States Patent [19]
Ogura

[11] Patent Number: 6,074,914
[45] Date of Patent: Jun. 13, 2000

[54] INTEGRATION METHOD FOR SIDEWALL SPLIT GATE FLASH TRANSISTOR

[75] Inventor: Seiki Ogura, Wappingers Falls, N.Y.

[73] Assignee: Halo LSI Design & Device Technology, Inc., Wappingers Fall, N.Y.

[21] Appl. No.: 09/182,777

[22] Filed: Oct. 30, 1998

[51] Int. Cl.[7] .................................................. H01L 21/336
[52] U.S. Cl. ......................................... 438/257; 438/593
[58] Field of Search ...................... 438/257, 593

[56] References Cited

U.S. PATENT DOCUMENTS

| | | | |
|---|---|---|---|
| 5,278,087 | 1/1994 | Jenq | 437/43 |
| 5,780,341 | 7/1998 | Ogura | 438/259 |
| 5,879,993 | 10/1999 | Chien et al. | 438/266 |
| 5,966,601 | 10/1999 | Ling et al. | 438/257 |
| 5,981,341 | 11/1999 | Kim et al. | 438/264 |

OTHER PUBLICATIONS

Y. Yamauchi, "A 5V–Only Virtual Grand Flash Cell with An Auxiliary Gate for High Density and High Speed Application" IEDM, 1991, pp. 319–322.

*Primary Examiner*—Matthew Smith
*Assistant Examiner*—Renzo N. Rocchegiani
*Attorney, Agent, or Firm*—George O. Saile; Stephen B. Ackerman

[57] ABSTRACT

A fabrication method for an electrically programmable read only memory device, which consists of a control/word gate and a floating gate on the side wall of the control gate. The unique material selection and blocking mask sequences allow simple and safe fabrication within the delicate scaled CMOS process environment, of a side wall floating gate with an ultra short channel under the floating gate, which involves double side wall spacer formation i.e., a disposable side wall spacer and the final polysilicon spacer gate.

20 Claims, 6 Drawing Sheets

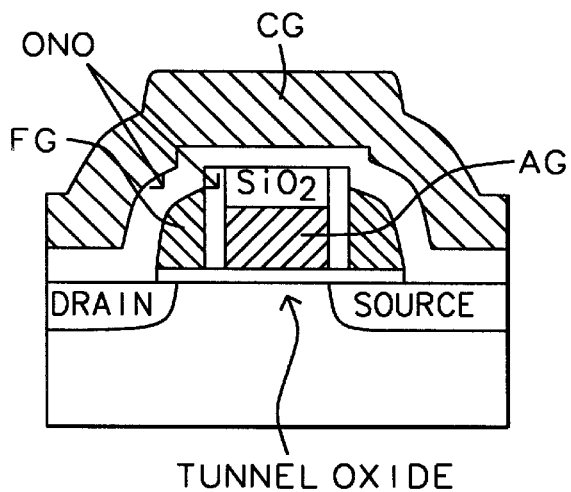
FIG. 1 – Prior Art
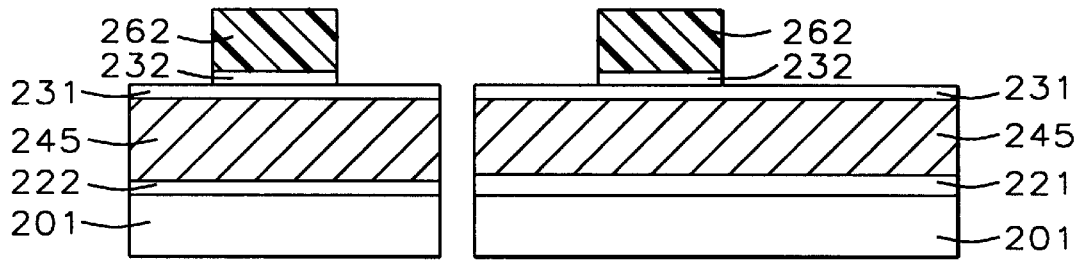
FIG. 2a
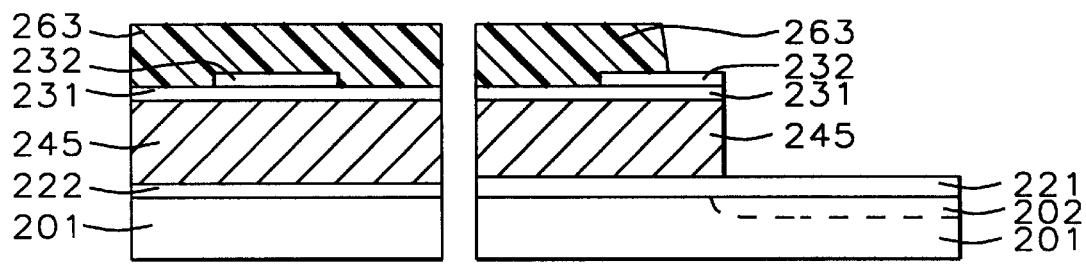
FIG. 2b

INTEGRATION METHOD FOR SIDEWALL SPLIT GATE FLASH TRANSISTOR

BACKGROUND OF THIS INVENTION

1) Field of the Invention

This invention relates to a fabrication method for an electrically programmable read-only memory device, which has high efficiency of electron injection from channel to floating gate.

2) Description of the Prior Art

Side wall polysilicon gates have been used as floating gates in Flash memory. As shown in FIG. 1 the typical side wall process forms spacers on both sides of the word gate, AG. However, because most of the embedded logic applications utilize only one floating gate, FG per word gate, the unused side spacer is removed or disabled. A tunnel oxide is under the floating gate, FG and word gate, AG. Source and Drain regions are in the silicon substrate. A silicon oxide layer, $SiO_2$ covers the gate, AG. Silicon oxide/silicon nitride/silicon oxide, ONO layers insulates the gates from one another. The control gate, CG is positioned above the device structure. Y. Yamauchi, "A 5V-only Virtual Ground Flash Cell with an Auxiliary Gate for High Density and High Speed Applications", IEDM 1991, page 319 implants N-dopants such as Arsenic or Phosphorus under the unwanted gate using a block mask, prior to formation of the side wall spacer, in order to short the unwanted gate to the adjacent diffusion. In another approach, the unwanted polysilicon gate material is used to fill the self aligned contact, as shown by Seiki Ogura U.S. Pat. No. 5,780,341.

In the U.S. Pat. No. 5,780,341 and the Patent Application of Seiki Ogura Ser. No. 09/128,585 filed Aug. 3, 1998 (HAL098-004), it is explained thata the ultra short Split Gate Flash Transistor provides high injection efficiency with low voltage and low current. Also, the fabrication technique to form controlably the ultra short channel, small as 30 nm by double sidewall technique had been shown.

However, in integrating the Split Gate Flash Transistor and high voltage devices in logic technology an optimum process which provides simplicity and reliability has not been considered enough. The logic gates, high voltage gates, and memory gates are all dimensionally critical and their relative positions are important. Therefore, it is preferable to define all three types of devices together at once rather than by separate masking processes. However, this preferred idea faces difficulty once the logic gate oxide becomes thin as 3.0 nm in the 0.18 micron feature size technology.

If the logic gates are formed prior to the side wall gates, the side wall spacers on the logic gates need to be removed, and the edges of the logic gate oxide could be damaged during the removal. On the other hand, if the logic gates are defined by a second critical mask after the memory word gates and spacer gates have been defined and formed, the damage to the logic gates' oxide during spacer removal, can be avoided. But the second approach requires two critical masks to define memory word gate and logic gate separately.

SUMMARY OF THE INVENTION

It is a principal object of this invention to define all three types of devices together at once rather than by separate masking processes.

It is a further object of this invention to form the sidewall polysilicon gate only on one side of the memory cell, but not to form the sidewall polysilicon gate on the logic and high voltage devices.

In the present invention, a new integration process is introduced, in which one critical mask is used to define all of the logic gates, high voltage devices, and the memory cells. But the side wall polysilicon gate is formed only on one side of the memory cell, where floating gate is wanted. Using a single critical mask step, simplifies the number of process steps and saves cost. An additional advantage of this process is the use of a logic gate side wall insulator, which protects the memory cells.

The enhancement mode channel length under the floating gate is between about 25 to 50 nm and is defined by first side wall spacer. The step edge is also defined by this first disposable side wall spacer, during step split transistor fabrication. The length of the N region is determined by the difference between the last polysilicon spacer and the first spacer thickness. The unique material selection and mask sequence allows formation of the side wall spacer gate on only one side of the split-word gate. Furthermore, logic gates are formed after forming of the side wall floating gates, thus protecting the delicate scaled complementary metal oxide semiconductor (CMOS) logic from the floating gate process steps.

A fabrication method for an electrically programmable read-only memory device, which has high efficiency of electron injection from channel to floating gate is provided. This memory cell consists of a silicon control gate and a side wall floating gate on the side wall of control gate. The floating gate has an ultra short channel device formed by the double side wall spacer technique.

The uniqueness of this invention is to fabricate safely, the side wall floating gate involving double sidewall spacer process in the delicate scaled CMOS process environment, using the following techniques:

(1) a composite layer of thin silicon oxide layer and silicon nitride layer on normal gate polysilicon are defined at once for logic, high voltage and memory devices. Using another block mask, only one side of the memory gate is etched, where the floating gate spacer should be formed.

(2) Disposable side wall spacer forms only on the etched side of polysilicon layer, and defines the ultra short channel of between about 25 to 60 nm by blocking implant of arsenic N dopant by disposable spacer, in order to provide low voltage and high speed Channel Hot Electron (CHE) programming.

(3) The disposable side wall spacer can be polysilicon, or doped polysilicon (which provides high etch rate compared to lightly doped silicon), or plasma deposited silicon oxynitride (which provides high etch rate compared to thermal silicon oxide).

(4) The final floating gate is formed on only one side of word gate transistor, in both the flat channel and step channel processes.

(5) Logic gates are defined after formation of the memory devices. In embedded flash or logic applications, the transistor count of logic is much higher than flash memory transistors, and the thinner silicon oxide logic devices are more delicate. Therefore, it is important to finish flash memory cell prior to logic device formation.

(6) Furthermore, all of the devices are defined by the original single critical mask.

(7) Logic spacer insulator is utilized to protect the memory cells.

BRIEF DESCRIPTION OF THE DRAWINGS

FIG. 1 shows the conventional device structure fabricated which has side wall gates on both sides of the word gate. The channel under the unwanted floating gate side is shorted by N implant.

FIGS. 2a through 2j are cross-sectional illustration of the side wall short channel split gate flash transistor during various stages in the manufacturing process of the present invention.

DESCRIPTION OF THE PREFERRED EMBODIMENTS

Figure 2C:
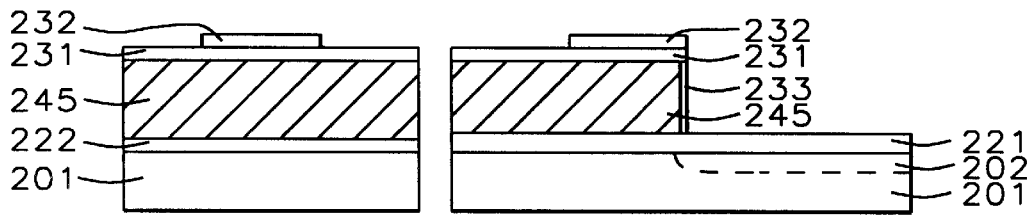

Presented in this invention is a simple and problem-free fabrication method by which side wall floating spacer gate formation for flat and/or step transistors, can be integrated with logic and high voltage device gate formation at the same time. The formation of shallow trench isolation, p-well, and n-well follows conventional CMOS process.

First, the two different gate silicon oxide thicknesses 222 and 221 for logic and memory word gate are formed. The polysilicon 245 for gate material is deposited by CVD, in the same manner as in a normal CMOS process. Deviation from the normal CMOS process starts after this polysilicon deposition. First, a very thin silicon oxide 231 (equal to between about 3 to 5 nm) is thermally or chemical vapor deposited (CVD) and followed by CVD silicon nitride 232 deposition thickness of between about 10 to 30 nm.

Then photoresist layer 262 and a masking process with exposure and development to define logic, high voltage and memory gates are performed. The silicon nitride layer is now etched vertically by reactive ion etching (RIE), using the underlayer silicon oxide as the etch stop. This step is shown in FIG. 2a, where the left transistor is a logic device which has the thinner gate silicon oxide between about 3.5 to 6.0 nm and sidewall polysilicon gate should not be formed. This left device can also be high voltage device with a thick gate silicon oxide (between about 10 to 12 nm). Here the silicon oxide thicknesses and critical dimensions are chosen for 0.25 micron technology. It is understood that these thicknesses and critical dimensions will scale with the technology as the critical dimension is reduced.

After removing the photoresist layer 262, another block mask 263 is applied to wherever the sidewall gate is wanted, as shown in FIG. 2b. Using the silicon nitride layer 232 as an etch stop layer, the right side of the first polysilicon is vertically etched. Then extra boron 202 is ion implanted at low energy (less than about 10 keV power and the ion dosage of between about 1 E 12 to 10 E 12 ions per $cm^2$, to adjust Vt under the floating gate.

Figure 2D:
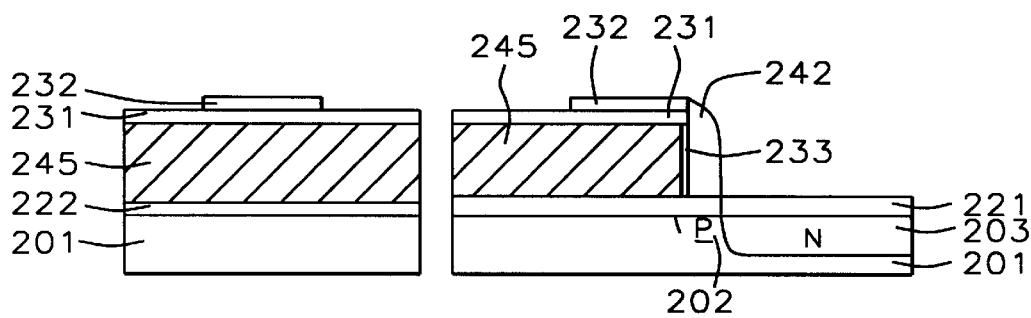

After removing the block mask photoresist layer 263, a thin silicon oxide layer 233 of less than about 5 nm is thermally grown on the sidewall polysilicon in FIG. 2c or CVD uniformly deposited as shown in FIG. 2c. A thin polysilicon layer typically having a thickness of between about 30 to 60 nm is then deposited. This polysilicon layer becomes a disposable side wall spacer. Then the vertical or anisotropic polysilicon etch is performed, which forms the disposable side wall spacer 242. Implantation with an N-dopant 203 such as arsenic or phosphorus follows, as shown in FIG. 2d. Thus, the thickness of the polysilicon layer determines the effective channel length under the side wall floating gate. The effective channel length is designed to be as short as 50 nm, in order to achieve very high injection efficiency.

Figure 2E:
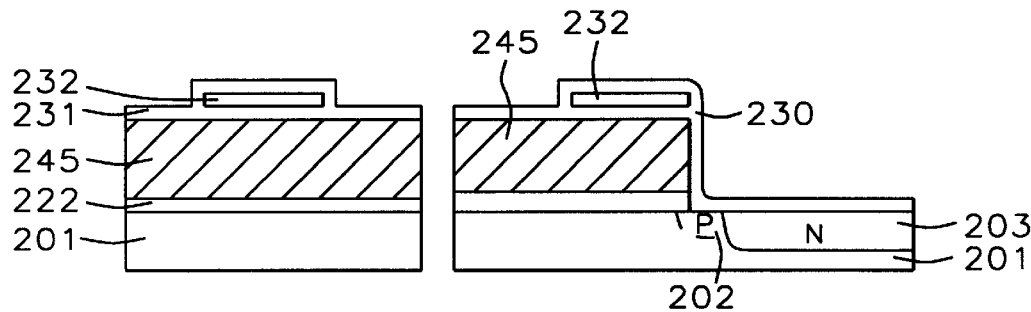

Afterwards, the disposable side wall spacer 242 is gently removed by a dry chemical, anisotropic etch. A typical etch ambient for this step is $HBr/Cl_2/O_2$. The bottom silicon oxide 221 is then gently etched out by buffered (with for example water or ammonium hydroxide) hydrofluoric acid (BHF), or Vapor HF or a reactive ion etch such as $CF_4/O_2$. A thin CVD of silicon oxide 230 with a thickness of between about 6.5 to 9.0 nm is deposited and rapid thermal oxidation is added to increase the oxide thickness to be between about 7.5 to 10.0 nm as shown in FIG. 2e. Short nitridation in an $N^2O$ environment can be added to improve the silicon oxide reliability and endurance in FIG. 2e.

Figure 2F:
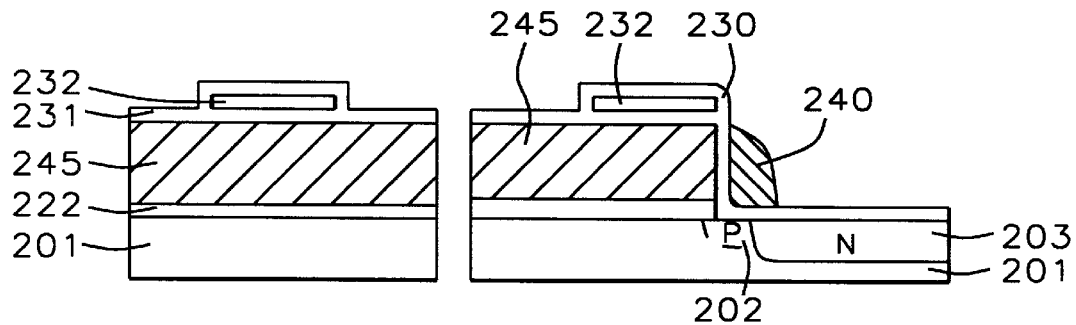
Figure 2G:
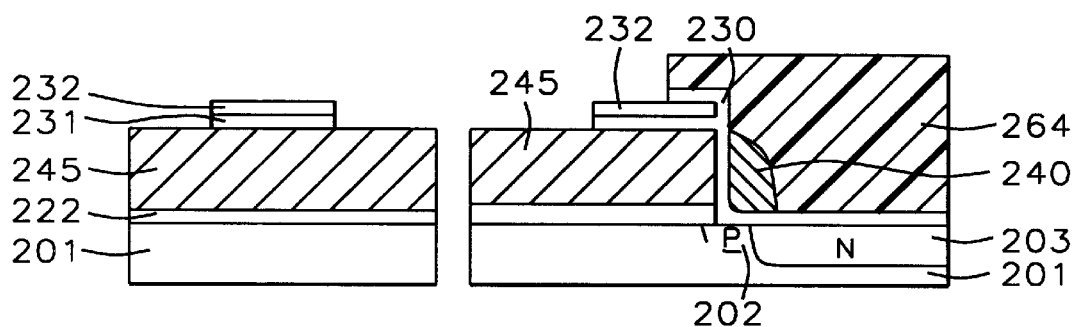

Then, an insitu phosphorus-doped polysilicon layer, which becomes the floating gate, is deposited having a thickness of between about 120 to 180 nm, and vertical or anisotropic polysilicon etch is performed to form the side wall floating gate 240, as shown in FIG. 2f. Then photoresist is deposited and a block mask 264 to protect side wall spacer gate is applied as shown in FIG. 2g. The silicon oxide layer over the silicon nitride layer is vertically etched until the silicon nitride layer is completely exposed.

Figure 2H:
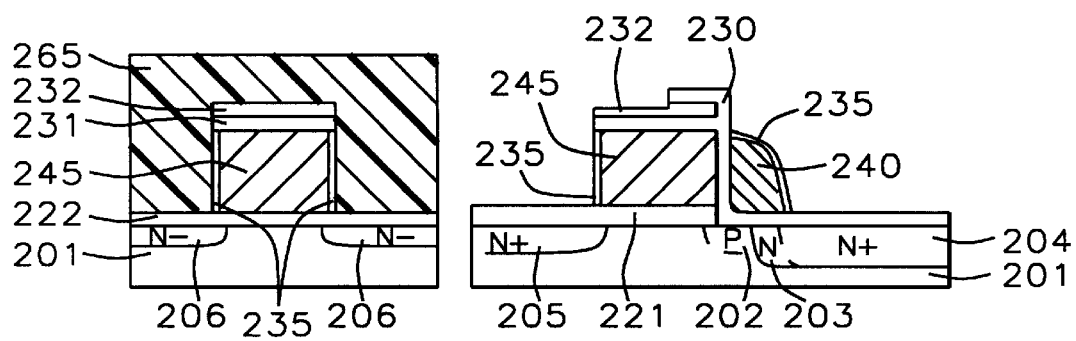

Then the polysilicon layer 245 is finally etched vertically using the silicon nitride layer and the underneath silicon oxide as the etch mask, as shown in FIG. 2h. Thus logic, high voltage, and memory word devices are defined together. Also, the photoresist mask 264 serves as slit mask, which separates the floating spacer gates between adjacent cells 240s (in FIG. 4), and reactive ion etch cuts the polysilicon spacer. Since an etching rate of 50 between polysilicon to silicon oxide is easily achieved, the 8 nm of silicon oxide over silicon nitride is sufficient to withstand polysilicon etch to separate adjacent floating gates. After removing photoresist 264, a thin silicon oxide layer 235 of between about 3 to 5 nm is thermally grown on the polysilicon side wall.

Normal lightly doped drain (LDD) implant 206 and 207, side wall insulator spacer formation and source/drain (S/D) implants 204 and 205 using a blockout mask 265 where the implants are not desired are shown in FIG. 2h. Also shown are the source/drain regions 208 and 209 in the logic device regions.

Figure 2I:
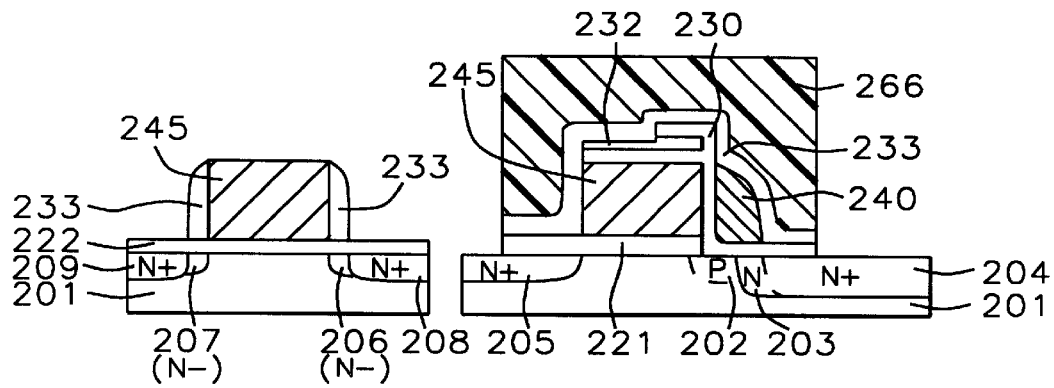
Figure 2J:
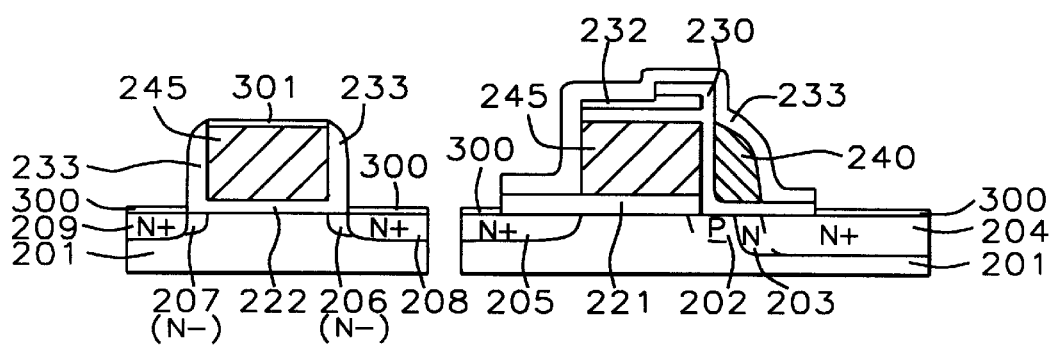

Referring now to FIG. 2i, during the formation of the composite layer of silicon nitride and silicon oxide side-wall insulator 233, a photoresist block mask 266 is utilized to cover the memory cell area. Thus, the floating gate edges are protected from spacer RIE and silicidation. The preferred silicidation process uses about 10 nm titanium or cobalt deposition and a Rapid Thermal Anneal at about 650° C. The stage after silicidation is shown in FIG. 2j wherein the contacts to the logic devices are for source/drain regions 206 is metal silicide layer 300 and gate is metal silicide layer 301. The contacts to the source/drain of the memory devices are metal silicide layer 300.

Figure 3:
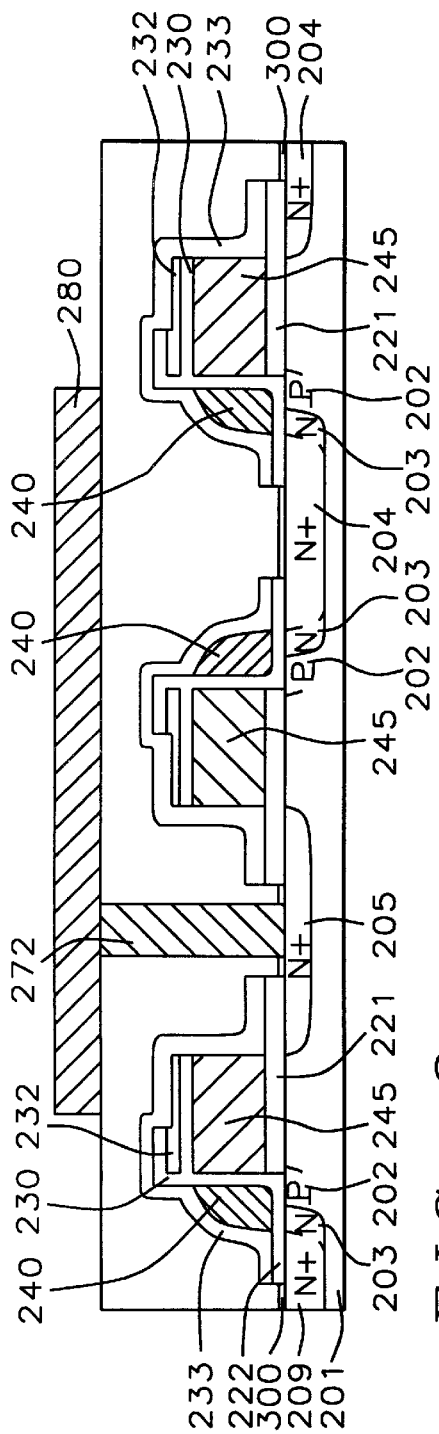
FIG. 3 shows the final device structure for a split gate with a controlable ultra short channel.
Figure 4:
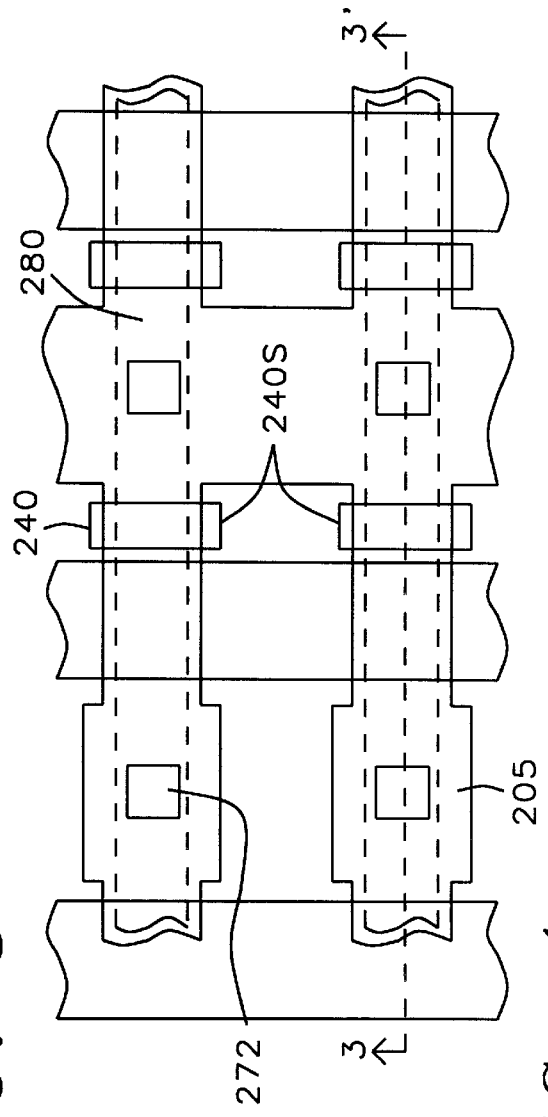
FIG. 4 shows the top view of a split gate transistor, with side wall short channel. The step split transistor has step under the floating side wall spacer gate.

Referring now to FIGS. 3 and 4, conventional passivation, contact hole metallurgy 272 and next level metal layer 280 formation are formed as shown in FIG. 3, at the process end. A typical bird's-eye view the memory cell is shown in FIG. 4. FIG. 3 is a cross-sectional representation taken along line 3:3' of FIG. 4. The preferred metals used are tungsten for the metal 272 and aluminium or copper doped aluminium for metal 280.

Figure 5:
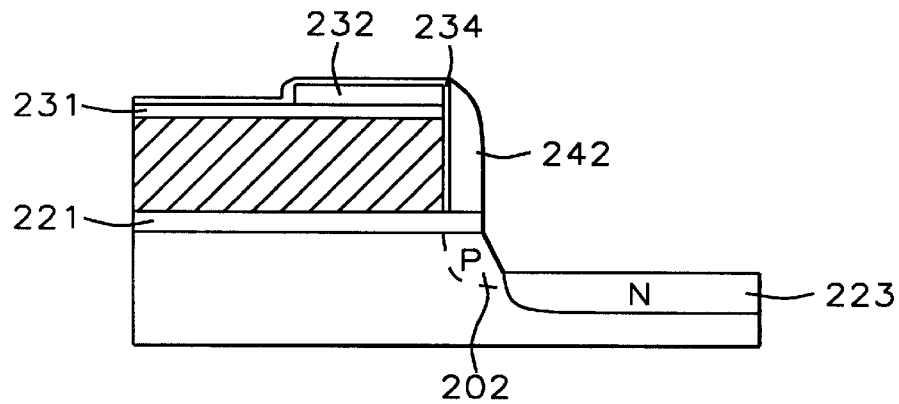
FIG. 5 shows another embodiment of the invention.

The preceding procedures describe fabrication of planar channel floating gates. By modifying and adding a few process steps, a step split structure as seen in FIG. 5 can be fabricated using the same innovative process integration scheme. The first of the process modifications is that thermal oxidation (233 in FIG. 2c) of the polysilicon side wall is substituted with CVD silicon oxide conformal deposition 234 of between about 4 to 7 nm as shown in FIG. 5. Then the polysilicon layer 242 for disposable spacer should be doped N+ during the deposition by insitu doping, shown in FIG. 2d. Then side wall spacer 242 is formed by vertical RIE as shown in FIG. 5, the silicon oxide layer 221 is vertically etched, and the step is etched into silicon substrate and bottom of the step is lightly implanted 203, as shown in FIG. 5. Then the N+ doped polysilicon disposable spacer is anisotropically plasma or hot phosphoric acid etched selectively to the lightly doped bulk N-region. The source bulk etching during this disposable spacer can be included as part of step etching. After gently etching off the leftover gate oxide 221 under disposable polysilicon spacer, the silicon surface is cleaned. Also, corner rounding by rapid thermal annealing (RTA) at between about 1000 to 1100° C. at between about 10 to 30 seconds can be added as an option at this point. After these modifications and additions, the fabrication sequence returns to the procedures described previously. By continuing with deposition of the CVD silicon oxide layer 230 in FIG. 2e, and otherwise following the process steps given for the planar split device, the step split device can be fabricated, as shown in FIGS. 2e to 2j.

In the above process steps for both the planar and step devices, the disposable side wall spacer 242 can be plasma silicon oxynitride, since the etching rate of that material to thermal silicon oxide can be very high (for example at least 10 times). The plasma formed silicon oxynitride spacer of between about 40 to 50 nm can be removed safely, providing the same structures as shown in FIG. 2d and FIG. 5.

Figure 6A:
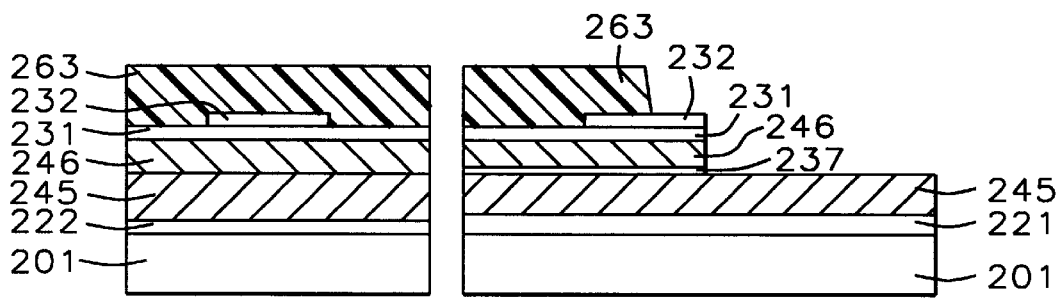
FIGS. 6a and 6b show an embodiment that uses a gate composed of polysilicon and a refractory metal silicide.
Figure 6B:
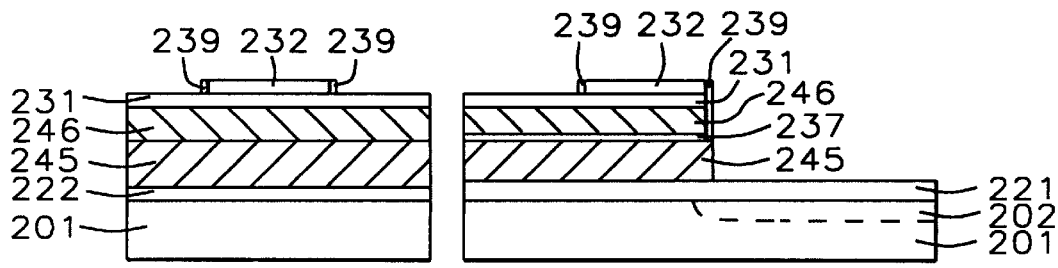

Referring now more particularly to FIGS. 6a and 6b there is shown another gate metallurgy scheme. Up to now the control gate 245 is assumed to be polysilicon. However, the same integration scheme can be applied to the composite gate layer of polysilicon and a refractory metal silicide, such as tungsten silicide, $WSi_2$. The control gate polysilicon layer 245 in FIG. 2a is replaced in this embodiment by the composite layer of polysilicon 245 and tungsten silicide layer 246 in FIG. 6a. However, a very thin silicon nitride layer 237 is deposited between the polysilicon layer 245 and the tungsten silicide layer 246 on the memory side only. The logic side does not have this layer 237. The layer 237 has a thickness of between about 5.0 to 10.0 nm.

When the memory side of the tungsten silicide 246 is etched using block mask 263 in FIG. 6a, which is equivalent to FIG. 2a, the thin silicon nitride layer 237 is used as the etch stop of tungsten silicide. After removing the photoresist layer 263, another composite layer 239 of silicon oxide of between about 5.0 to 10.0 nm and silicon nitride of between about 5 to 10 nm is deposited. Then a vertical or anisotropic etch is performed to form the silicon nitride spacer 239 to enclose the tungsten silicide layer as shown in FIG. 6b. Since the tungsten silicide layer is easily oxidized and the silicon oxide layer is not high quality as an insulator, the silicon nitride enclosure of the tungsten silicide will protect the oxidation of the tungsten silicide layer 246 from the subsequent oxidation process in the formation of layer 231 in FIG. 2c and 230 in FIG. 2e. Once the memory side edge of the control gate is defined as shown in FIG. 6b, the subsequent processes follow exactly the same process sequence as the disposable sidewall spacer formation in FIG. 2e and thereafter.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an electrically programmable read only memory device which is a control/word gate and a floating gate on the side wall of the control/word gate comprising:

providing a stack of layers on a silicon substrate, which layers include a gate silicon oxide layer, a conductive polysilicon gate layer, a silicon oxide layer and a silicon nitride layer;

etching said silicon nitride layer to the dimension of said control/word gate;

forming a block out mask over said silicon nitride layer of the dimension of said control/word gate to allow only the side uncovered to which said floating gate is to be formed;

vertically etching said stack of layers to said gate silicon oxide layer to form a vertical sidewall while using said silicon nitride layer on said side uncovered as the mask;

removing said block out mask; forming an insulator layer on said vertical sidewall;

forming a disposable sidewall spacer layer on said vertical sidewall over said insulator layer, wherein the width of said spacer layer is a channel for said device;

ion implanting a N type dopant into said substrate to form a device region therein;

removing said disposable sidewall spacer layer; and forming a floating gate sidewall spacer on said vertical sidewall and over said channel.

2. The method of claim 1 wherein said channel is planar.

3. The method of claim 1 wherein said channel is non-planar and further comprising:

vertically etching into said substrate after said forming a disposable side wall spacer layer and before said ion implanting to form said non-planar channel.

4. The method of claim 1 wherein said disposable sidewall spacer is composed of polysilicon.

5. The method of claim 1 wherein said disposable sidewall spacer is composed of silicon oxynitride.

6. The method of claim 1 wherein said channel length is between about 30 to 60 nm.

7. The method of claim 1 and further comprising:

forming logic devices in non-memory device area and using simultaneous process steps to form both logic and memory elements.

8. The method of claim 1 wherein said conductive polysilicon layer includes a refractory metal silicide over said polysilicon layer and a silicon nitride layer between said metal silicide layer and said polysilicon layer.

9. A method of fabricating an electrically programmable read only memory device which is a control/word gate and a floating gate on the side wall of the control/word gate while also fabricating logic gates associated therewith in a same silicon substrate comprising:

providing a stack of layers on a silicon substrate, which layers include a gate silicon oxide layer, a conductive polysilicon gate layer, a silicon oxide layer and a silicon nitride layer;

etching said silicon nitride layer to the dimension of said control/word gate in a memory cell area and to the dimension of the logic gate in non-memory areas;

forming a block out mask over said silicon nitride layer of the dimension of said control/word gate to allow only the side uncovered to which said floating gate is to be formed;

vertically etching said stack of layers to said gate silicon oxide layer to form a vertical sidewall while using said silicon nitride layer on said side uncovered as the mask;

removing said block out mask;

forming a insulator layer on said vertical sidewall;

forming a disposable sidewall spacer layer on said vertical sidewall and over said insulator layer, wherein the width of said spacer layer is a channel for said device;

ion implanting a N type dopant into said substrate to form a device region therein;

removing said disposable sidewall spacer layer;

forming a floating gate sidewall spacer on said vertical sidewall and over said insulator layer, and over the channel;

forming a block out mask over said silicon nitride layer to cover and protect said control/word gate and said floating gate and to allow all other areas to be uncovered;

removing the exposed said silicon oxide layer;

vertically etching said polysilicon layer to said gate silicon oxide layer to form a vertical sidewall on the opposite side of said floating gate in the memory cell area and to form the logic device gates in logic areas while using said silicon nitride layer on said side uncovered as the mask;

removing said block out mask; and forming lightly doped drain devices by ion implantation and using a sidewall spacer technique into logic areas at said logic gates.

10. The method of claim 9 wherein the sidewall spacer formed by said sidewall spacer technique is composed of the same material and formed at the same time as the protecting insulating layer over said memory device.

11. The method of claim 9 wherein said channel is planar.

12. The method of claim 9 wherein said channel is non-planar and further comprising:

vertically etching into said substrate after said forming a disposable side wall spacer layer and before said ion implanting to form said non-planar channel.

13. The method of claim 9 wherein said disposable sidewall spacer is composed of polysilicon.

14. The method of claim 9 wherein said disposable sidewall spacer is composed of silicon oxynitride.

15. The method of claim 9 wherein said channel length is between about 30 to 60 nm.

16. A method of fabricating an electrically programmable read only memory device which is a control/word gate, a floating gate on the sidewall of the control/word gate, and an ultra short, non-planar channel comprising:

providing a stack of layers on a silicon substrate, which layers include a gate silicon oxide layer, a conductive polysilicon gate layer, a silicon oxide layer and a silicon nitride layer;

etching said silicon nitride layer to the dimension of said control/word gate;

forming a block out mask over said silicon nitride layer of the dimension of said control/word gate to allow only the side uncovered to which said floating gate is to be formed;

vertically etching said stack of layers to said gate silicon oxide layer to form a vertical sidewall while using said silicon nitride layer on said side uncovered as the mask;

removing said block out mask; forming a insulator layer on said vertical sidewall;

forming a disposable sidewall spacer layer on said vertical sidewall over said insulator layer, wherein the width of said spacer layer is a channel for said device;

vertically etching into said substrate to form a step within said substrate;

ion implanting a N type dopant into said step within said substrate to form a device region therein within having said non-planar channel;

removing said disposable sidewall spacer layer; and forming a floating gate sidewall spacer on said vertical sidewall and over said channel.

17. The method of claim 16 wherein said disposable sidewall spacer is composed of polysilicon.

18. The method of claim 16 wherein said disposable sidewall spacer is composed of silicon oxynitride.

19. The method of claim 16 wherein said channel length is between about 30 to 60 nm.

20. The method of claim 16 and further comprising:

forming logic devices in non-memory device area and using simultaneous process steps to form both logic and memory elements.

* * * * *